US009016233B1

(12) United States Patent
Weiner et al.

(10) Patent No.: US 9,016,233 B1
(45) Date of Patent: Apr. 28, 2015

(54) VOLUME COMBINATORIAL PROCESSING CHAMBER

(75) Inventors: Kurt Weiner, San Jose, CA (US);
Aaron Francis, San Jose, CA (US);
John Schmidt, Oakland, CA (US)

(73) Assignee: Intermolecular, Inc., San Jose, CA (US)

( * ) Notice: Subject to any disclaimer, the term of this patent is extended or adjusted under 35 U.S.C. 154(b) by 1445 days.

(21) Appl. No.: 12/108,456

(22) Filed: Apr. 23, 2008

(51) Int. Cl.
*B05C 3/20* (2006.01)
*H01L 21/67* (2006.01)
*C23C 16/458* (2006.01)
*C23C 16/455* (2006.01)

(52) U.S. Cl.
CPC .. *C23C 16/45502* (2013.01); *B01J 2219/00283* (2013.01); *H01L 21/67017* (2013.01); *B05C 3/20* (2013.01)

(58) Field of Classification Search
CPC ............... B01J 2219/00283; C23C 16/45502; B05C 3/20
See application file for complete search history.

(56) References Cited

U.S. PATENT DOCUMENTS

| | | | |
|---|---|---|---|
| 5,694,843 A * | 12/1997 | Chen | 101/123 |
| 6,368,865 B1 * | 4/2002 | Dahl et al. | 436/155 |
| 6,758,951 B2 * | 7/2004 | Giaquinta et al. | 506/32 |
| 7,063,982 B1 * | 6/2006 | Karlsson et al. | 436/37 |
| 7,288,411 B2 * | 10/2007 | Akporiaye et al. | 436/155 |
| 7,544,574 B2 * | 6/2009 | Chiang et al. | 438/297 |
| 7,807,109 B2 * | 10/2010 | Diamond et al. | 422/112 |
| 7,871,928 B2 * | 1/2011 | Chiang et al. | 438/680 |
| 7,902,063 B2 * | 3/2011 | Chiang et al. | 438/627 |
| 2002/0106813 A1 * | 8/2002 | Smith et al. | 436/180 |
| 2003/0049862 A1 * | 3/2003 | He et al. | 436/180 |
| 2005/0056215 A1 * | 3/2005 | Shimoda | 118/668 |
| 2007/0029189 A1 * | 2/2007 | Zach | 204/228.3 |
| 2007/0089857 A1 * | 4/2007 | Chiang et al. | 118/725 |
| 2007/0199510 A1 * | 8/2007 | Weiner et al. | 118/719 |
| 2008/0156769 A1 * | 7/2008 | Weiner et al. | 118/719 |
| 2009/0155936 A1 * | 6/2009 | Weiner et al. | 438/17 |

* cited by examiner

*Primary Examiner* — Dah-Wei D Yuan
*Assistant Examiner* — Binu Thomas (57) ABSTRACT

A reactor assembly having vertically adjustable flow cells is provided. The vertically adjustable flow cells include passageways for distributing a fluid to a reaction region isolated below a bottom surface of corresponding flow cells. The adjustable flow cells enable another dimension of variability for combinatorial processing. Thus, additional data may be gathered for effects on process parameter variations, material variations, process sequence variations, etc., for semiconductor processing operations.

19 Claims, 8 Drawing Sheets

VOLUME COMBINATORIAL PROCESSING CHAMBER

BACKGROUND

Semiconductor processing employs techniques for depositing layers, removing layers, defining features (e.g., etch), preparing layers (e.g., cleans), doping or other processes that do not require the formation of a layer on the substrate. In addition, similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the semiconductor manufacturing processes. However, semiconductor companies conduct R&D on full wafer processing through the use of split lots, as the processing systems are designed to support this processing scheme. This approach has resulted in ever escalating R&D costs and the inability to conduct extensive experimentation in a timely and cost effective manner.

With regard to wet processing techniques utilized in the semiconductor industry, current research and development techniques are unable to efficiently evaluate the variation of process parameters, materials, process sequences, etc., in an efficient manner. Even if a system was available to more efficiently evaluate processes and materials, the system should be able to mimic the conditions for full wafer processing so that the processes can scale if the system operates on a smaller scale.

Thus, an improved technique for accommodating the evaluation of multiple different process variations on a single substrate is provided to more efficiently evaluate the viability of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a method and system for varying a volume of a reaction chamber for combinatorial processing of a substrate. It will be obvious, however, to one skilled in the art, that the present invention may be practiced without some or all of these specific details. In other instances, well known process operations have not been described in detail in order not to unnecessarily obscure the present invention.

The embodiments described below provide site isolated reactors having dispense heads capable of vertical movement for combinatorial processing in accordance with one embodiment of the invention. With the design described herein, the volume of the reaction chamber is modifiable through the vertical adjustment of a flow cell. In one embodiment, the flow cell is a monolithic block design in which both the reactor and the facilities interface are combined into one integral unit. In another embodiment, the flow cell is a modular design with the facilities portion separate from the reactor portion. A rack assembly provides the structure and support to lift and lower the flow cells individually or together. In one embodiment, the force to lift and lower the rack assembly is provided by a motorized actuator as described below in more detail.

The embodiments described below further provide details for a multi-region processing system and associated processing heads that enable processing a substrate in a combinatorial fashion. Thus, different regions of the substrate may have different properties, which may be due to variations of the materials, unit processes (e.g., processing conditions or parameters) and process sequences, etc. Within each region the conditions are preferably substantially uniform so as to mimic conventional full wafer processing within each region, however, valid results can be obtained for certain experiments without this requirement. As described in more detail below, the different regions are isolated from each other so that each reaction chamber can vary an aspect of the processing in order to generate data enabling the identification of an optimum process from a single substrate.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial processing and return the substrate to the manufacturing process flow for further processing. Alternatively, the substrate can be processed in an integrated tool that allows both combinatorial and conventional processing in various chambers attached around a central chamber. Consequently, in one substrate, information concerning the varied processes and the interaction of the varied processes with conventional processes can be evaluated. Accordingly, a multitude of data is available form a single substrate for a desired process.

Figure 1A:
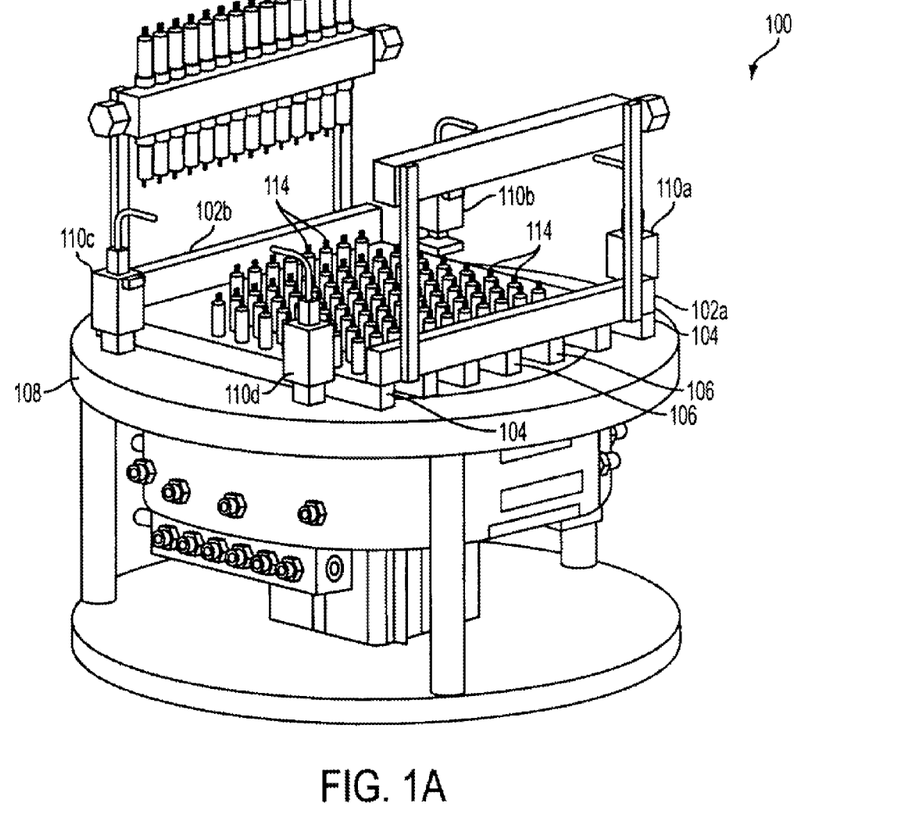
FIG. 1A is a simplified schematic diagram illustrating a perspective view of a reactor assembly having actuators configured to vary the vertical location of a plurality of flow cells within a reactor assembly in accordance with one embodiment of the invention.

FIG. 1A is a simplified schematic diagram illustrating a perspective view of a reactor assembly having actuators configured to vary the vertical location of a plurality of flow cells within a reactor assembly in accordance with one embodiment of the invention. Reactor assembly 100 includes base plate 108 on top of which is mounted a support assembly, which may be referred to as a frame, that includes rack 102a and opposing rack 102b. Racks 102a and 102b have cross members 104 and 106 extending between racks 102a and 102b and across a reactor plate of reactor assembly 100. Cross members 104 and 106 are affixed to racks 102a and 102b, as well as flow cells disposed within each reaction region of the reactor assembly. It should be appreciated that the flow cells may be referred to as valve elements. In one embodiment, cross members 104 are outer cross members providing rigidity and alignment. Outer cross members are affixed to corresponding actuators 110a and through 110d. In one embodiment, the actuators are motorized, however, this is not meant to be limiting. In this embodiment, the outer cross members 104 are not affixed to flow cells as inner cross members 106 are attached to flow cells. In the embodiment where the actuators are motorized, actuators 110a through 110b, which can be linear driven actuators, will provide the force necessary to lift the entire rack assembly so that the corresponding flow cells will lift or drop accordingly to adjust a reaction volume. Flow cells disposed within the reactor assembly include valves 114 disposed thereon to direct fluid into or out of the corresponding flow cell and reaction region thereunder. In one embodiment, a plurality of tubes is distributed to ports on the flow cell and these tubes are not illustrated in order to more clearly depict the reactor assembly. Cross members 106 are affixed to a top surface of the flow cell as depicted in more detail with reference to FIGS. 2A and 2B.

Figure 1B:
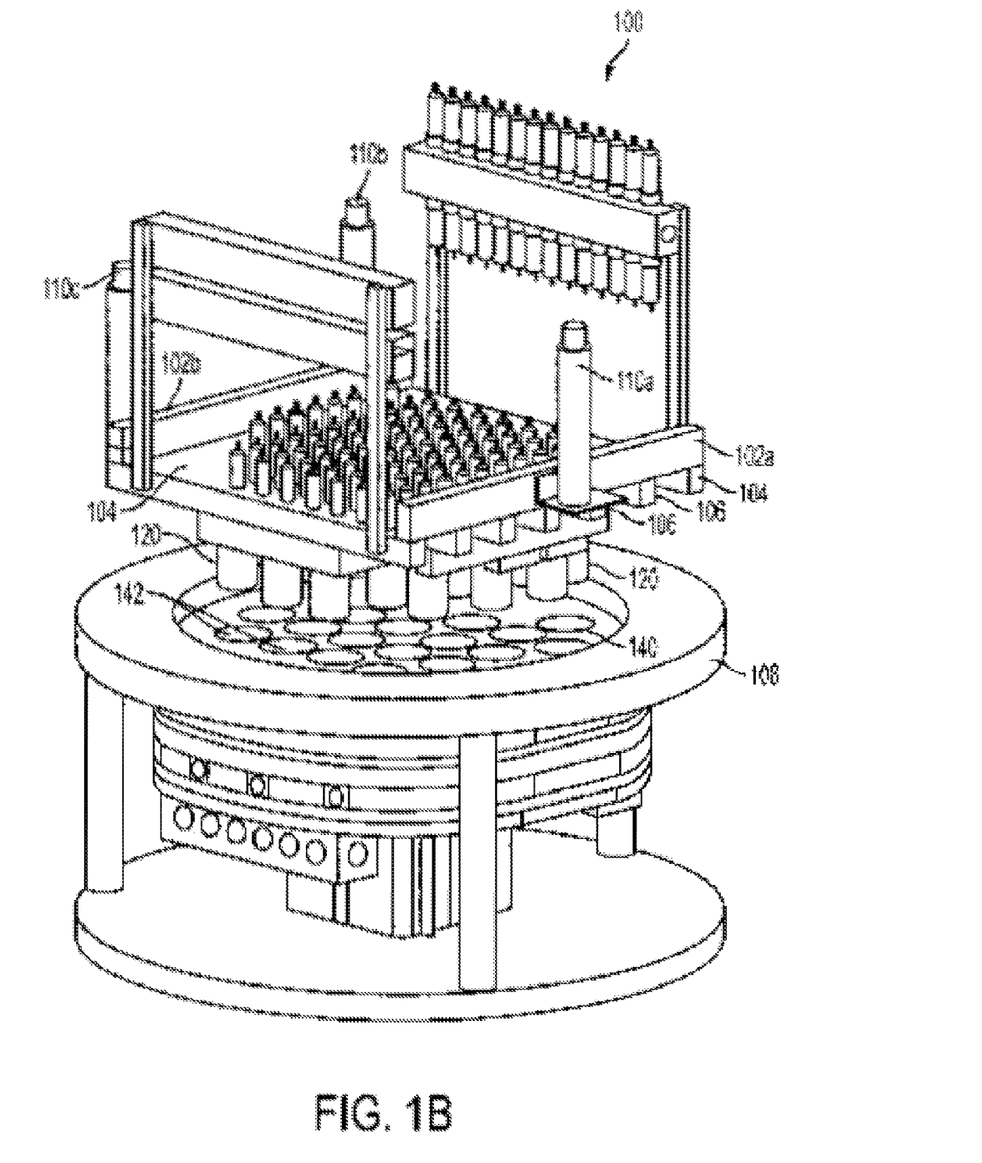
FIG. 1B illustrates a perspective view of the reactor assembly with the rack assembly lifted from the base plate in order to better illustrate the reactor block of the base plate in accordance with one embodiment of the invention.

FIG. 1B illustrates a perspective view of the reactor assembly with the rack lifted from the base plate in order to better illustrate the reactor block in accordance with one embodiment of the invention. Reactor block 140 includes a plurality of reaction chambers 142 distributed thereon. While a specific shape and pattern is shown in FIG. 1B for the reaction chambers and the distribution of the reaction chambers, respectively, it should be appreciated that any suitable shape and pattern is possible to be integrated with the embodiments described herein. That is, the shape of reaction chambers 142 may be other geometric shapes rather than a circle and reactor block 140 may be a quadrilateral or other geometric shapes. Flow cells 120 are distributed and each flow cell may be associated with a single reaction chamber 140 in one embodiment. In some embodiments, multiple flow cells can be associated with a single reaction chamber. Flow cells 120 are substantially aligned with each corresponding reaction region in order for the rack system, also referred to as a support structure, to move in a vertical direction. Racks 102a and 102b and corresponding cross members, which are affixed to flow cells 120, may be driven through drive actuators as illustrated in FIG. 1A. In FIG. 1B, three drive motors 110a-c are provided. One skilled in the art will appreciate that various drives may be employed to lift and lower the reaction assembly. Exemplary drives include pneumatic lifts, gear drives, linear drives, screw drives, voice coils, etc. Cross members 106 and 104 provide the necessary rigidity in order to maintain the alignment between each of the flow cells and corresponding reaction regions. Cross members 106 may be affixed to flow cells 120 by any known technique, such as affixed through threaded connections, welds, glue, snap fittings, press fittings, etc. In one alternative actuator scheme, a single motor may drive a chain or pulley connected to gear mechanisms that drive a post downward or upward based on the direction of the motor rotations. In this embodiment, the gear mechanisms may be distributed as actuators 110a-d or 110a-c, with the motor disposed within a plane of the chain or pulley. One skilled in the art will appreciate that numerous other designs are possible as long as the design provides vertical movement of the flow cells to adjust the volume between a surface of the substrate and a bottom surface of the flow cell. It should be appreciated that the embodiments described herein accommodate adjustability of the individual flow cells without having to reconfigure the tool. The motorized adjustment allows the reaction chambers to be easily modified for different experiments. In one embodiment, the flow cells may be supported at different heights on racks 102a and 102b as well as corresponding cross members. That is, racks 102a and 102b, as well as the cross members, are configured so that the bottom surfaces of the flow cells supported by the racks may all have different distances from the surface of the substrate. In this manner, some flow cells may be positioned at a height, e.g., 5 mm from a surface of a substrate, commensurate with a flow mode, while others are positioned at a height, e.g., 0.5 mm from a surface of a substrate, commensurate with a bucket mode as will be explained in more detail below. For example, an individual motor or other mechanism for individually actuating each flow cell can be used.

Figure 2:
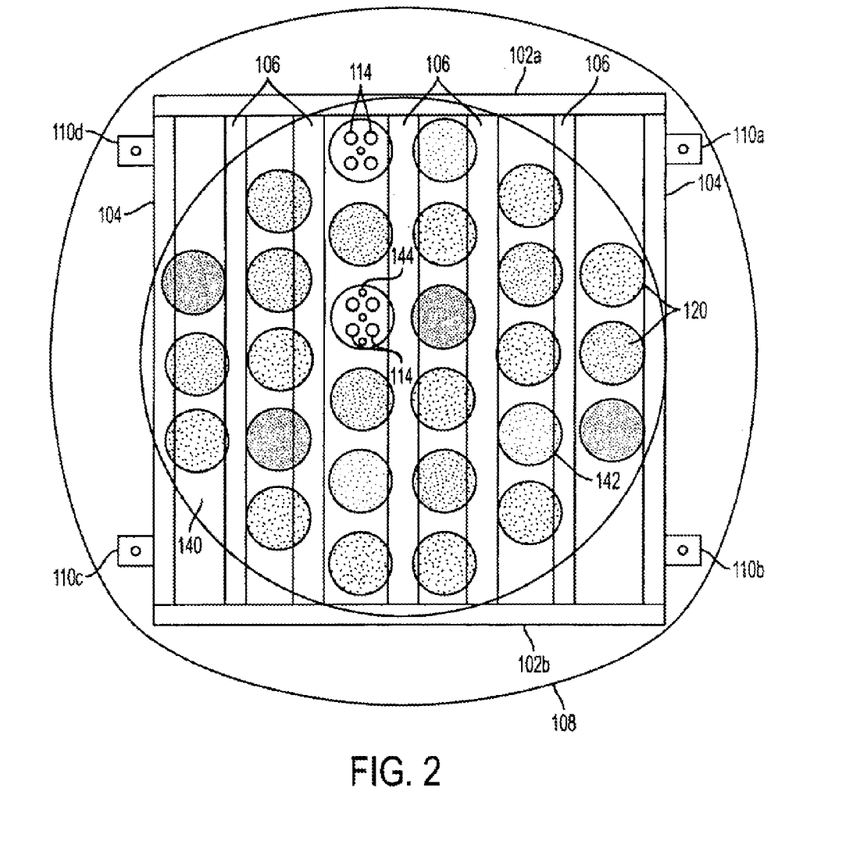
FIG. 2 is a top view of a combinatorial processing system having the capability to vary a volume within reaction chambers in accordance with one embodiment of the invention.

FIG. 2 is a top view of a combinatorial processing system having the capability to vary a volume within reaction chambers in accordance with one embodiment of the invention. Base plate 108 includes reactor block 140. Reactor block 140 is a monolithic block having a plurality of openings which function as reaction chambers 142 in one embodiment. Disposed within reaction chambers 142 are flow cells 120. As described with reference to FIG. 6, a sleeve may be between a side surface of flow cell 120 and the sidewall of a corresponding reaction chamber 142 to isolate regions on the substrate where the reaction or fluid flow will occur. In this embodiment, the sleeves provide a seal to contain the fluid within an isolated region on the surface of the substrate defined within reaction chamber 142 and under flow cell 120. Racks 102a and 102b are part of a rack assembly disposed over base plate 108. Cross members 104 and 106 are attached to racks 102a and 102b in order to provide a rigid structure to support the flow cells for vertical movement to adjust a reaction region volume. Outer cross members 104 are affixed to corresponding actuators 110a-d. The placement and the number of actuators 110a-d is exemplary and not meant to be limiting, as the placement and the number of actuators are configured to provide smooth and aligned vertical movement for the flow cells within the corresponding reaction chambers. In the embodiment of FIG. 2, the motorized actuator drives a post or member against the surface of base plate 108 to vertically translate the rack assembly up or down. Actuators 110a-d are affixed to outer cross members 104 by brackets having threaded connections in one embodiment. Other known techniques may be substituted for affixing the actuators to the cross members. A bottom surface of cross members 106 is in contact with respective flow cells 102 so that the rack assembly moves vertically in unison in one embodiment.

As illustrated in FIG. 2, the flow cells and reaction chambers are aligned in six rows and seven cross members 104 and 106 are in contact with the twenty eight flow cells. This configuration is exemplary and not meant to be limiting as the rack assembly can be adapted to integrate with any substrate/reaction chamber/flow cell shape, as well as alternative substrate shapes, e.g., quadrilateral shapes. In addition, the rack assembly may be configured so that the pitch of the flow cells is adjustable. That is, the distance between adjacent flow cells or reactors is adjustable. In one embodiment each flow cell may be moveably disposed on the racks to adjust the pitch. In another embodiment, a row of flow cells may be moveably supported to adjust the pitch. The flow cells may be mounted on corresponding rails which are supported through additional rails. A modular design is provided for flow cells as well as modular blocks for each corresponding row of flow cells. For example, the modular blocks can be moved to adjust the pitch along the rails. In addition, a modular sleeve enclosure is provided for a lower portion of each process module in one embodiment, thereby enabling adaptability of the system to any pitch of regions on a substrate.

In the manner described above, flow cells may be moved in one linear direction as they are slidably mounted on rails of one rail system and the corresponding rows to which each flow cell belongs is slidably mounted on the rails of a second rail system. Thus, the movement of the rows along rails of the second rail system is in a linear direction substantially perpendicular to the direction of movement along rails of the first rail system, enabling access to the entire surface of a substrate disposed thereunder. Thus, through the slideable mounting and rail configuration any pitch for any substrate may be accommodated with this design. Flow cells 120 of FIG. 2 include valves 114 and inlet/outlet ports 144. Fluid provided to flow cell 120, through inlet ports 144, is distributed to the reaction region through channels or passageways defined within flow cell 120. Access to the channels or passageways within flow cell 120 is enabled through valves 114. For example, valves 114 may be two-way, three-way, four-way, etc., valves, thereby enabling a bypass to waste as well as access to one or more channels. Inlet ports 144 are in fluid communication with a fluid dispensing mechanism, such as a pump and reservoir or a pressurized reservoir containing the fluid to be delivered.

Figure 3:
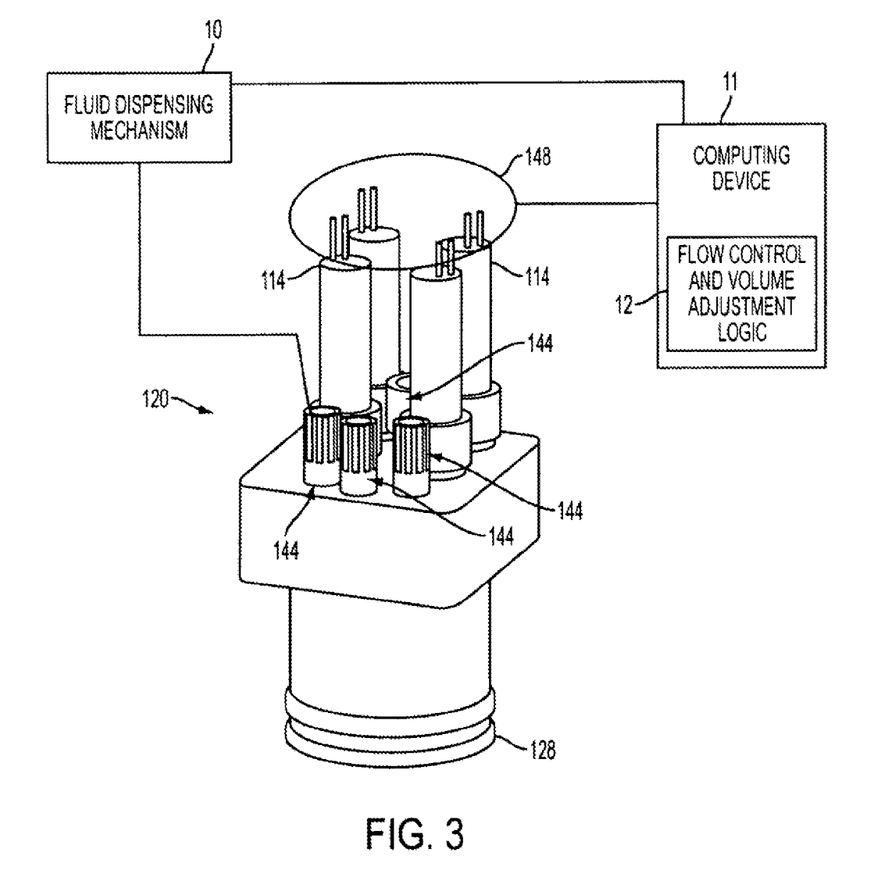
FIG. 3 is a simplified schematic diagram illustrating a unitary design of a flow cell in accordance with one embodiment of the invention.

FIG. 3 is a simplified schematic diagram illustrating a unitary design of a flow cell in accordance with one embodiment of the invention. Flow cell 120 includes a top portion having valving and process inlets and outlets disposed thereon. Valves 114 enable various flow paths/passageways inside flow cell 120. Ports 144 are process inlets into flow cell 120 to corresponding flow paths defined within the flow cell, as well as outlets. In one embodiment, one of the outlet ports 144 is connected to a vacuum source in order to remove process waste. One skilled in the art will appreciate through the valving and drilling of the various interconnections or passageways within flow cell 120, a number of combinations of flows may be defined. For example, each valve may independently provide a flow of fluid to a substrate surface, the flows from each of the valves may be mixed, or the flows may be combined in some combination between independent flows and complete mixing of each flow. Fluid dispensing mechanism 10 is in flow communication with flow cell 120 through one or more process inlet 144 to provide fluid to the reaction region. Fluid dispensing unit 10 may be a pump in flow communication with a reservoir of fluid or a pressurized reservoir where valves 144 are configured to control the flow paths for the fluid provided from the pump or pressurized reservoir. Valves 114 are provided with electrical contacts 148 so that the valves may open or close according to the electrical signals delivered to contacts 148. In one embodiment, computing device 11 controls the operation of each of the valves for the flow cells and the fluid dispensing mechanism, as well as the motorized actuators of FIGS. 1A and 1B, through flow control and volume adjustment logic 12. One skilled in the art will appreciate that computer code residing in memory configured to be executed by a processor of computing device 11 can achieve the above described functionality. The flow cells may be in flow communication with one or more reservoirs of differing fluids in order to provide different mixtures of fluids to the flow cells. Accordingly, the fluid compositions, the volumes of the reaction chambers, and other processing parameters, such as temperature, flow rate, etc., as well as process sequence order and unit processes, may be combinatorially varied. This combinatorial variation provides an abundant amount of data from a single substrate so that an evaluation of an optimum process can be more efficiently performed. In one embodiment, a processor executing software instructions may be used to control the combinatorial process so that regions of the substrate are processed in serial, parallel or some combination of the two. The software instructions or the recipe for the processing of each reaction region may also control the volume of the chamber through movement of the motorized actuators as mentioned herein. One skilled in the art will appreciate that numerous configurations and combinations are possible to perform the processing combinatorially where each region of the substrate has a local uniformity, representative of conventional full wafer processing.

Figure 4A:
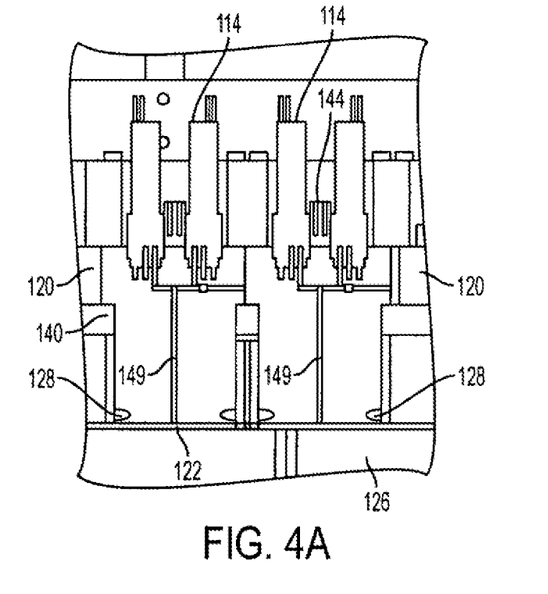
FIGS. 4A and 4B illustrate cross sectional views of the reactor assembly in accordance with one embodiment of the invention.
Figure 4B:
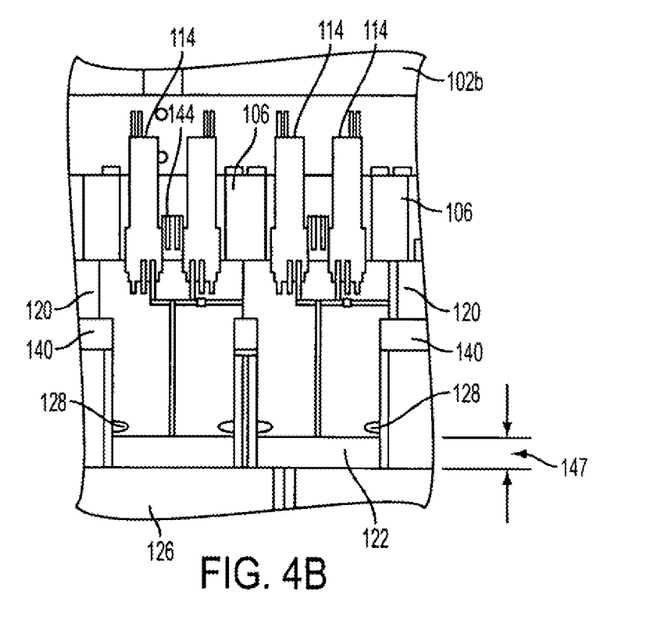

FIGS. 4A and 4B illustrate cross sectional views of the reactor assembly in accordance with one embodiment of the invention. Flow cell 120 is disposed within the reaction region defined by the reaction chambers within reactor block 140. Cross members 106 which are rigidly attached to rack 102b, are also affixed to a top surface of flow cell 120. It should be appreciated that numerous methods may be used to affix cross member 106 to flow cell 120 including threaded connections, gluing, dovetail rails, etc. Valves 114 and various process outlets and inlets 144 are also positioned near a top surface of flow cell 120. Within flow cell 120, channels are disposed so that fluid may be delivered to corresponding reaction regions 122 defined between a bottom surface of flow cell 120 and a top surface of a substrate 126 within each reaction region. Peripheral channel 128 defined around a lower portion of flow cell 120 is in flow communication with a vacuum source in order to evacuate fluid within region 122.

FIG. 4A illustrates flow cell 120 proximate to a surface of substrate 126. In this embodiment, flow cell 120 is utilized in a flow mode. That is, fluid delivered to the surface of substrate 126 is continuously supplied and flows over the surface of substrate 126 while being removed through vacuum plenum 128. Exemplary flow mode operations performed on substrate 126 include various cleaning operations for cleaning a semiconductor substrate prior to performing a semiconductor operation or after performing a semiconductor operation. In this embodiment, radial flow is supplied from center channel 149 into the reaction region. It should be noted that the radial flow may be laminar, i.e., characterized by uniform velocity in terms of magnitude and direction, in one embodiment. In another embodiment, the flow may be turbulent or some combination of turbulence and laminarity in the flow sequence. The embodiments described herein also provide for laminar flow from one side of a reaction chamber to another side of the reaction chamber. The fluid flows to the outer edges of the reaction region under flow cell 120 towards vacuum plenum channel 128. In one embodiment, the flow mode is used to evaluate various cleaning operations performed during semiconductor manufacturing. Where the flow mode is used, the distance from a bottom surface of the flow cell and the top surface of the substrate may be between about 0.25 mm to about 0.5 mm. Where a bucket mode is used, the gap may be about 5 mm or more. It should be noted that the gap can be variable to influence velocity and flow uniformity in other embodiments and is not limited to the exemplary ranges provided herein.

In another embodiment, as depicted in FIG. 4B the flow cell is utilized in a bucket mode operation where solution is delivered to reaction region 122 allowed to reside there for a certain time period and then evacuated once the flow cell is lowered through vacuum plenum 128. For example, in one embodiment, an approximate ten millimeter gap 147 is supplied between the bottom of flow cell 120 and top of substrate 126. Gap 147 may be adjusted through the embodiments described herein to any suitable gap for either a bucket mode operation or a flow mode operation. A fluid may be placed into the reaction chamber and allowed to reside in region 122 for a certain residence time to enable or allow a reaction to take place. Upon completion of the reaction, or expiration of the specified time period, flow cell 120 is lowered so that the evacuation of the fluid within region 122 may be efficiently performed. It should be appreciated that the flow cell is lowered at a rate so as to not cause any back pressure within the reaction region. In one embodiment, the flow cell is lowered through the drive mechanism, such as the mechanism as described with reference to FIGS. 1A and 1B so that a bottom surface of the flow cell contacts a top surface of the fluid within the reaction region. Vacuum through peripheral channel 128, removes the fluid as the flow cell continues to lower within the reaction chamber (i.e., the cell "squeezes" the fluid out of the chamber). Flow cell 120 may include a passageway that functions as a vent to further avoid a back pressure situation. In one alternative embodiment, a stirring mechanism may be placed within region 122 through flow cell 120 in order to provide agitation or stirring for the reaction taking place in a bucket mode configuration as illustrated in FIG. 5B. It should be appreciated that the embodiments described herein enable a plurality of experiments to take place on a surface of the substrate in order to evaluate numerous parameters and processes in an efficient manner. In one embodiment, a portion of the flow cells may be in a bucket mode operation while a remaining portion may be in flow mode operation. For example, with individually actuated flow cells, some could be near the substrate (i.e., in flow mode), and others could be farther from the substrate (i.e., in bucket mode). One skilled in the art will appreciate that the bucket mode operation may be used for electroless deposition operations or electrochemical deposition operations, while flow mode can be used for cleaning operations. In addition, cross members 106 may have different heights thereby enabling different levels of volumes for reaction regions 122 so that some flow cells operate in bucket mode, while others operate in flow mode. In an alternative embodiment, cross members 106 may be placed between adjacent flow cells rather than disposed on top of the top surface of flow cells 120. In still yet in another embodiment, each flow cell is individually adjustable. In this embodiment, each flow cell may have a dedicated actuator to provide the vertical movement or the racks supporting the flow cells may have different height/vertical orientations so that movement of the entire rack essentially adjusts each flow cell differently.

Figure 5A:
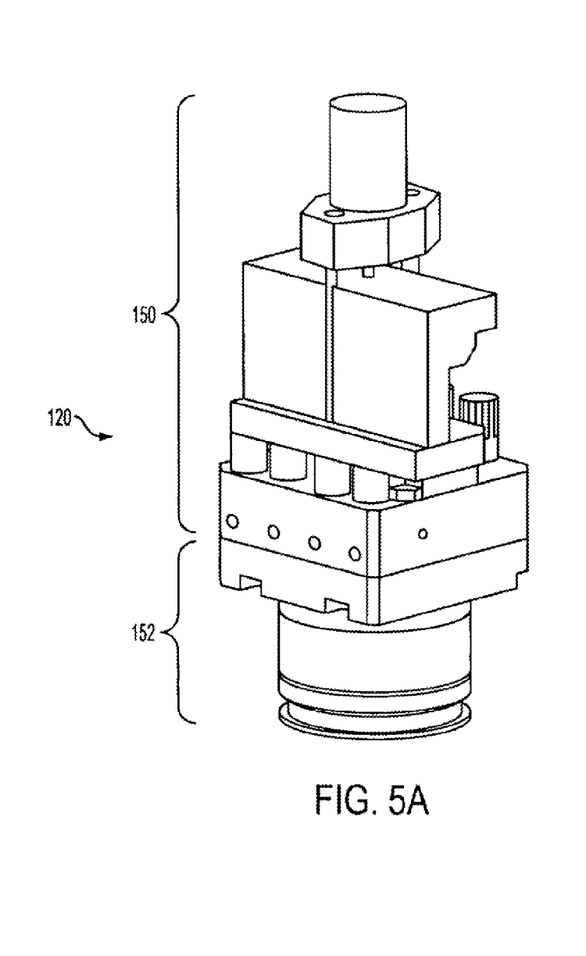
FIGS. 5A and 5B are simplified schematic diagrams of alternative flow cells in accordance with one embodiment of the invention.
Figure 5B:
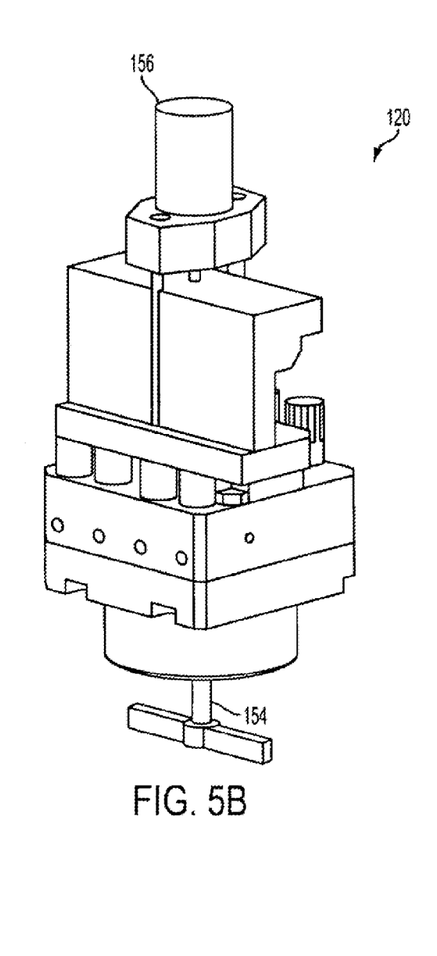

FIGS. 5A and 5B are simplified schematic diagrams of alternative flow cells in accordance with one embodiment of the invention. Flow cell 120 of FIGS. 5A and 5B may be modular in design. The modularization of the flow cell is achieved by grouping the common facilities requirements in one portion (a "facilities module") and enabling a second portion (a "process module") to be interchanged depending on the experiment or characteristics needed. Common facility requirements include providing inlet ports for a chemical solution and outlet ports for removing waste from the reaction vessel, the valving and bypasses necessary to achieve desired flow combinations, providing electrical connections for valves, as well as applying a potential inside the reactor cell, and/or drive mechanisms, for providing rotation for agitation, scrubbing, brushing, etc. A pressure based feed through may enable agitation or scrubbing in one embodiment, and an electrical feed through may be desired to provide a bias internal to the reaction chamber, e.g., for electroplating experiments. Integrating these features on a single block that incorporates a standardized interface to a second module that dictates the flow, agitation, and other characteristics within the reaction chamber provides a much more efficient design. Thus, when different characteristics or capabilities are required, process changes are achieved by replacing the process module, which is removably mated to the facilities module.

Still referring to FIGS. 5A and 5B, flow cells 120 include a top portion 150 and a detachable bottom portion 152. FIG. 5A provides flow cell 120 for use in either bucket or flow mode, while FIG. 5B illustrates flow cell 120 that includes stirrer 154, which may also be referred to as an agitator, for use in bucket mode operations. It should be appreciated that other rotating tools and probes may be incorporated with the embodiments described herein. For example, tools such as brushes, chemical mechanical planarization (CMP) pads, and electrodes are some exemplary tools. Stirrer 154 is driven by motor 156 attached to top portion 150 of flow cell 120. It should be noted that various paddle designs may be included for stirrer 154 as the paddle design of FIG. 5B is exemplary and not meant to be limiting. Motor 156 may also be used to provide the force necessary to raise or lower flow cell 120, e.g., in the embodiment where each flow cell is individually adjustable for determining the volume of the reaction region. In one embodiment, motor 156 may be a pneumatic cylinder or bladder that may be able to support movement of the flow cell in a vertical direction as well as rotation of the tool. In another embodiment, a single motor may drive multiple flow cells/tool, e.g., through a belt and pulley system. In another embodiment, motor 156 may be used in conjunction with the motorized actuators of FIGS. 1A and 1B. In this embodiment, the motorized actuators may provide a coarse adjustment, and motors 156 may provide a fine adjustment for each flow cell or valve element independently.

Figure 6:
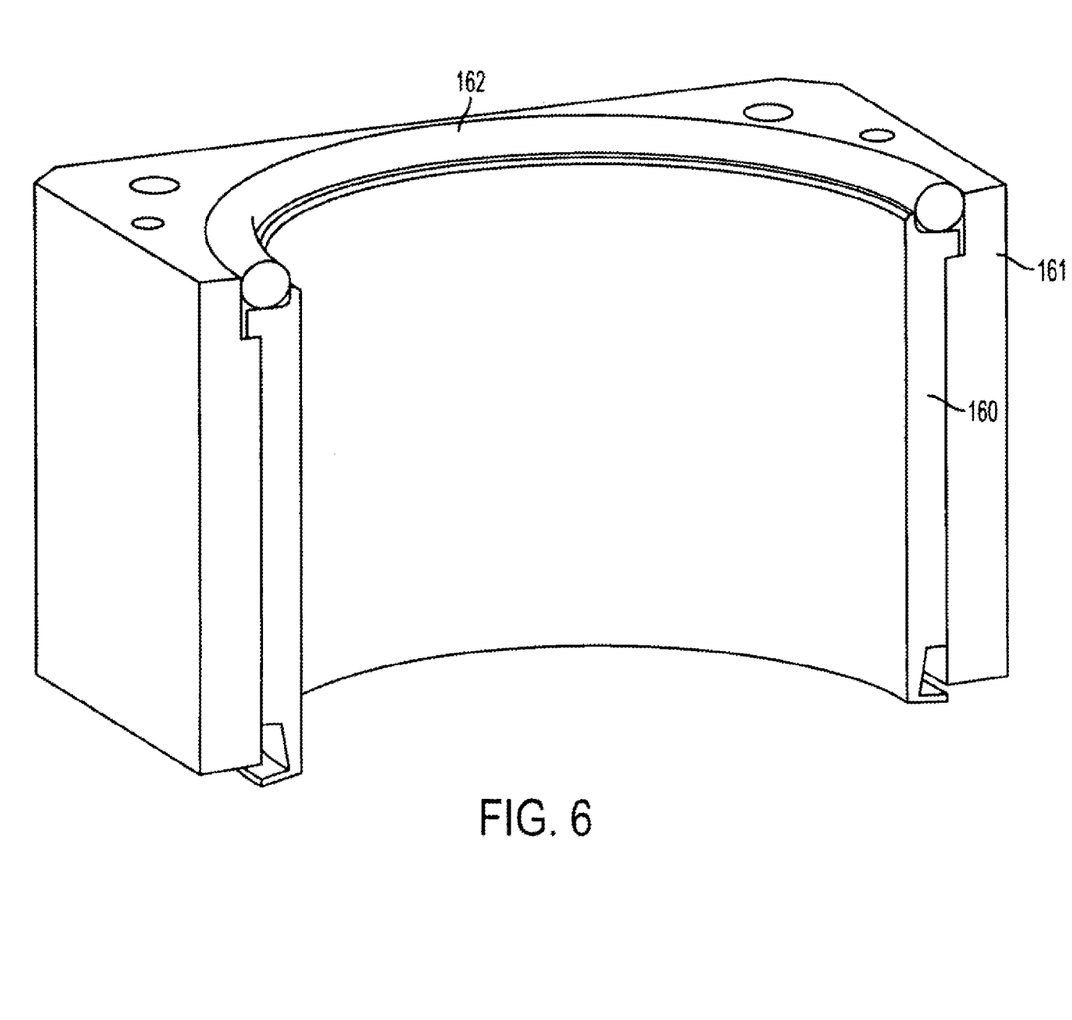
FIG. 6 is a simplified schematic diagram for a sleeve within a reaction chamber that defines a processing region around and below the process module when disposed over a substrate in accordance with one embodiment of the invention.

FIG. 6 is a simplified schematic diagram for a sleeve within a reaction chamber that defines a processing region around and below the process module when disposed over a substrate in accordance with one embodiment of the invention. In FIG. 6, a bottom surface of sleeve 160 is designed to seal with a top surface of a substrate and encompass the lower portion of the flow cell. O ring 162 sits on a shoulder defined on a top surface of sleeve 160 and provides an upper seal with a bottom surface of the flow cell as well as provide a compliant spring section to allow the sleeve to float and provide a sealing force between the sleeve and substrate surface. In this manner, the processing region is isolated from an external environment. As mentioned above, slots may be provided for rails to support the reaction chambers when the reaction chambers are separate pieces as opposed to a unitary block. The flow cells can also be provided with slots for rails in order to replace the cross members in one embodiment. Thus, the sleeves and the enclosures are moveable along with the flow cell in order to eliminate the need for a monolithic plate that has a fixed pitch for the location of the reaction regions relative to the surface of the substrate. In one embodiment, sleeve 160 may be formed from polytetrafluoroethylene, while enclosure 161 may be formed from any suitable material capable of supporting sleeve 160. O-ring 162 may be composed of any chemically inert material compatible with the fluids used for processing.

Figure 7:
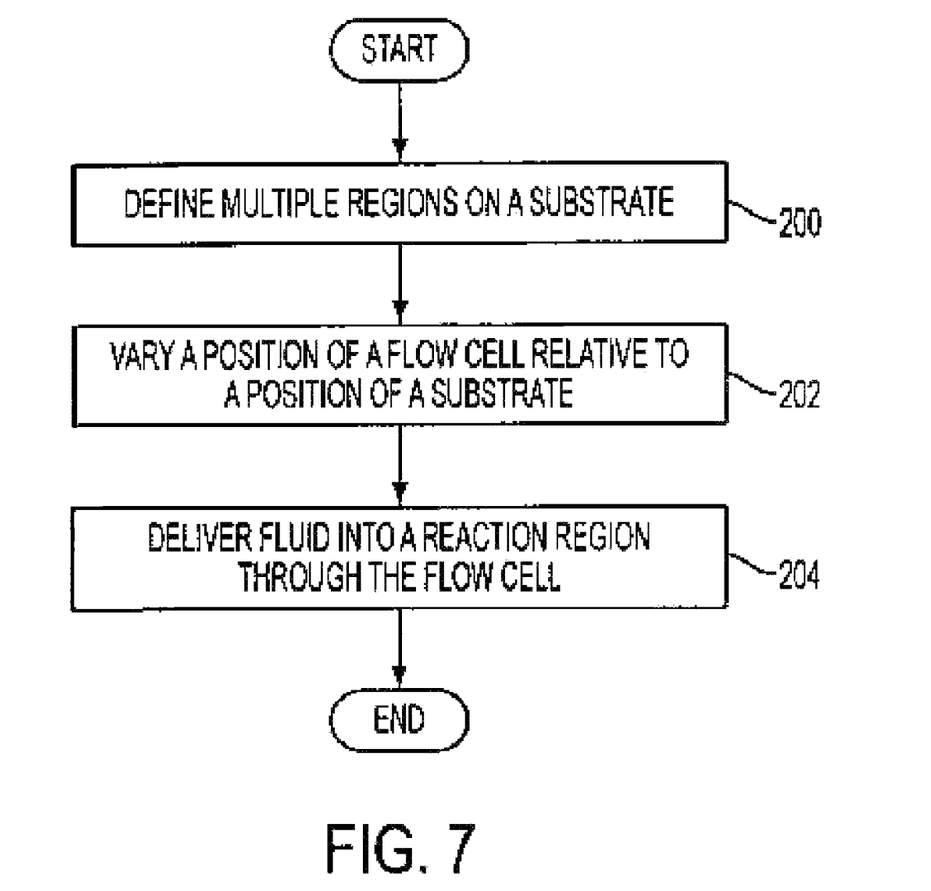
FIG. 7 is a flow chart diagram illustrating the method operations for combinatorially processing a substrate in accordance with one embodiment of the invention.

FIG. 7 is a flow chart diagram illustrating the method operations for combinatorially processing a substrate in accordance with one embodiment of the invention. The method initiates with operation 200 where multiple regions of a substrate are defined. The multiple regions are isolated from each other by the sealed chambers described above. Flow cells (which may also be referred to as valve elements) are disposed in each of the chambers over the isolated region of the substrate. The method then proceeds to operation 202 where a position of a flow cell or valve element relative to the position of the substrate is varied. The varying of the position will cause the volume of the reaction region defined within the chamber and between the bottom surface of the flow cell and the top surface of the substrate to vary. As illustrated in the Figures above, the position of the flow cell and the volume in the reaction region may be modified by individually driving the flow cells or simultaneously driving the flow cells through a rack system. As mentioned above, the processing is performed combinatorially in one embodiment where some regions/reaction chambers are operated in flow mode while others are operated in bucket mode. In addition, different fluids, e.g., fluid compositions, different flow rates for the fluids, and other processing parameters and sequences may be varied to provide more data on a single substrate. The method then proceeds to operation 204 where fluid is delivered into the reaction region through the flow cell. It should be appreciated that the processing may take place with similar reaction region volumes defined by each of the plurality of flow cells disposed over the substrate, different reaction region volumes, or some combination of the two. In addition, numerous combinations of fluids, processing parameters, etc., can be used with the different isolated regions. Furthermore the processing may be performed in a serial manner, a parallel manner or a fast serial manner. In another embodiment, different processes can be performed in different isolated regions. For example, cleaning processes may occur in one isolated region while a deposition process occurs in another isolated region, either contemporaneously or sequentially.

In one embodiment, after operation 204, the reaction region can be characterized using techniques including electrical testing (e.g., measuring for resistance, leakage, capacitance, etc.), imaging (e.g., scanning electron microscopy (SEM), tunneling electron microscopy (TEM), atomic force microscopy (AFM), etc.), visual examination, composition analysis (e.g., using x-ray diffraction (XRD)) and other techniques. The results of the characterization can be evaluated to determine the efficacy of the processing of the region. For example, the evaluation can determine that using a larger volume during processing can be advantageous for certain processing techniques.

In summary, adjustable flow cells are provided to enhance the combinatorial processing thereby adding another dimension of variation to be considered when conducting experiments, especially with wet processing semiconductor operations. It should be appreciated that the flow cells can be adjustable relative to a substrate to change a volume defined over a region of a substrate. Additionally, the height of the flow cells may be offset from each other either through variation as to placement on the support structure or through individual actuators for each flow cell. Accordingly, fluid provided to the reaction regions may have varying processing parameters as described above for additional combinatorial processing conditions on a single substrate.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A reactor assembly for processing in a combinatorial manner, the reactor assembly comprising:
   a chamber comprising a sleeve,
      wherein the sleeve comprises an O-ring and a flow cell,
         wherein the O-ring sits on a shoulder defined on a top surface of the sleeve,
         wherein a bottom surface of the sleeve is configured to seal with a surface of a substrate and encompasses a lower portion of the flow cell;
         wherein the O-ring creates an upper seal with a bottom surface of the flow cell as well as creates a compliant spring section that allows the sleeve to float;
         wherein the compliant spring section creates a sealing force between the sleeve and the surface of the substrate,
         wherein the substrate is impermeable to fluid;
         wherein the flow cell defines a volume within the chamber for the processing,
         wherein the flow cell comprises a first end and a second end,
         wherein the flow cell is movable in a vertical direction within the chamber to adjust the volume defined between the surface of the substrate and a bottom surface of the flow cell;
   a first rail system having a first plurality of rails,
      wherein the flow cell comprises slots allowing the flow cell to be slidably mounted on at least one rail in the first plurality of rails of the first rail system and moveable in a single linear direction along the first rail system;
   a second rail system having a second plurality of rails,
      wherein a row to which the flow cell belongs is slidably mounted thereon,
      wherein a movement of the row along at least one rail in the second plurality of rails of the second rail system is in a linear direction substantially perpendicular to the direction of movement along the at least one rail in the first plurality of rails of the first rail system enabling access to all portions of the surface of the substrate disposed thereunder,
      wherein the first rail system and the second rail system are configured to adjust the flow cell to a pitch based on (1) each flow cell in the row being moveably disposed on the at least one rail in the first rail system and the second rail system or (2) the row being moveably supported by additional rails,
      wherein the sleeve is moveable along the first rail system and the second rail system with the flow cell disposed therein for further defining the location of the reaction regions relative to the surface of the substrate using both the volume defined by the flow cell and the pitch; and
   a fluid dispensing mechanism coupled to the flow cell and in fluid communication with the volume, the fluid communication being via a passageway extending through the flow cell to deliver fluids to the volume.

2. The reactor assembly of claim 1 wherein the passageway terminates in a top portion of the flow cell centrally disposed in the first end of the flow cell.

3. The reactor assembly of claim 1
wherein the passageway terminates in a top portion of the flow cell centrally disposed in the first end of the flow cell, and
wherein the fluid dispensing mechanism introduces a fluid into the volume through the passageway to form radial flows in the volume away from the top portion.

4. The reactor assembly of claim 1 further comprising a motor operably coupled to move the flow cell between a first position and a second position within the chamber.

5. The reactor assembly of claim 1 further comprising
a motor operably coupled to move the flow cell between a first position and a second position,
wherein the flow cell defines the volume at the first position to be greater than a quantity of fluid to be disposed therein.

6. The reactor assembly of claim 1 further comprising
a motor operably coupled to move the flow cell between a first position and a second position,
wherein the flow cell defines the volume at the second position to be approximately equal to a quantity of fluid to be disposed therein.

7. The reactor assembly of claim 1
wherein the first end of the flow cell is disposed within the chamber, and
wherein the second end of the flow cell is disposed outside of the chamber.

8. The reactor assembly of claim 1 further comprising
a frame, and
a motor connected to the frame,
wherein the chamber is a first chamber in a plurality of chambers and wherein the flow cell is a first flow cell in a plurality of flow cells,
wherein each of the plurality of flow cells has a respective first end disposed in a different one of the plurality of chambers,
wherein the plurality of flow cells is coupled to the frame, and
wherein the motor is operably connected to move the frame relative to the plurality of chambers.

9. The reactor assembly of claim 1 wherein the chamber is a first chamber in a plurality of chambers, and
wherein the flow cell is a first flow cell in a plurality of flow cells,
wherein each of the plurality of flow cells has a respective first end disposed in a different one of the plurality of chambers, and
wherein each of the plurality of flow cells is independently movable with respect to the substrate.

10. The reactor assembly of claim 8 wherein the fluid dispensing mechanism is a first fluid dispensing mechanism in a plurality of fluid dispensing mechanisms,
wherein each of the fluid dispensing mechanisms dispenses the same fluid, and
wherein each fluid dispensing mechanism is coupled to a second end of a different one of the plurality of flow cells.

11. A reactor assembly for processing in a combinatorial manner, the reactor assembly comprising:
a frame;
an actuator connected to the frame;
a plurality of chambers, wherein each of the plurality of chambers comprises a different sleeve,
wherein the sleeve is configured to seal with a substrate;
wherein the substrate is impermeable to fluid;
a plurality of flow cells, wherein each of the plurality of flow cells is disposed in a different one of the plurality of chambers, and
wherein each of the plurality of flow cells defines a volume within the respective chamber in which it is disposed,
wherein each of the plurality of flow cells comprises a first end and a second end,
wherein the plurality of flow cells is coupled to the frame, and
wherein the actuator is operably connected to move the frame relative to the plurality of chambers between a first position and a second position to vary the volume of at least one of the plurality of chambers;
a first rail system having a plurality of rails, wherein the plurality of flow cells are slidably mounted on at least one rail of the first rail system and moveable in a single linear direction along the first rail system;
a second rail system having a plurality of rails,
wherein the plurality of flow cells are arranged in rows, and
wherein the rows comprising the flow cells are slidably mounted on the second rail system;
wherein the each of the plurality of flow cells is movable in a vertical direction within the respective chamber in which it is disposed to adjust the volume defined between the surface of the substrate and a bottom surface of the each of the plurality of flow cells; and
wherein the actuator is a first actuator in a plurality of actuators,
wherein each of the plurality of actuators is coupled to a different corresponding flow cell, and
wherein the each of the plurality of actuators is configured to independently move the different corresponding flow cell to vary the volume of the respective chamber in which it is disposed,
a plurality of fluid dispensing mechanisms,
wherein each of the plurality of the flow cells is coupled to a different one of the plurality of fluid dispensing mechanisms to introduce fluid into the volume of each respective chamber.

12. The reactor assembly of claim 11, wherein the plurality of chambers defines a plurality of regions of the substrate disposed below the plurality of chambers.

13. The reactor assembly of claim 11 wherein each of the plurality of fluid dispensing mechanisms is in fluid communication with the volume of the each respective chamber,
wherein the fluid communication is via a different passageway extending between the first end and the second end of the flow cell disposed in the each respective chamber to deliver fluids to the each volume,
wherein the each different passageway and terminates in a top portion of the respective flow cell, centrally disposed in the first end of the respective flow cell.

14. The reactor assembly of claim 13 wherein the each different passageway terminates in a top portion of the respective flow cell, centrally disposed in the first end of the respective flow cell,
wherein the each of the plurality of fluid dispensing mechanisms introduces the fluid into the each respective chamber through the each different passageway to form radial flows in the each volume away from the top portion of the each respective flow cell.

15. The reactor assembly of claim 11 wherein the actuator is operably coupled to move the frame between the first position and the second position, wherein the first position defines the volume of the at least one of the plurality of chambers to have a magnitude greater than a quantity of fluid to be disposed therein.

16. The reactor assembly claim 11 wherein the actuator is operably coupled to move the frame between the first position and the second position, wherein the first position defines the volume of the at least one of the plurality of chamber to have a magnitude that is approximately equal to a quantity of fluid to be disposed therein.

17. The reactor assembly of claim 1,
wherein the chamber is a first chamber disposed in a first opening in a plurality of openings in a monolithic reactor block,
wherein a second chamber is disposed in a second opening in the plurality of openings of the reactor block, and
wherein the reactor block is disposed in a base plate.

18. The reactor assembly of claim 8, further comprising one or more reservoirs of differing fluids,
wherein the fluid dispensing mechanism is in fluid communication with the one or more reservoirs of differing fluids in order to provide different mixtures of fluids to the plurality of flow cells.

19. The reactor assembly of claim 12,
wherein a single region of the substrate is disposed below the each of the plurality of chambers, such that a total number of regions of the substrate equals a total number of chambers in the plurality of chamber, and
wherein each single region of the substrate is isolated from each other single region of the substrate because each of the plurality of chambers is sealed from the other chambers in the plurality of chambers.

\* \* \* \* \*